United States Patent
Raman et al.

(10) Patent No.: US 11,255,696 B2
(45) Date of Patent: Feb. 22, 2022

(54) BRIDGE SENSOR BIASING AND READOUT

(71) Applicant: Melexis Technologies SA, Bevaix (CH)

(72) Inventors: Johan Raman, Knesselare (BE); Pieter Rombouts, Mariakerke (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 89 days.

(21) Appl. No.: 15/962,266

(22) Filed: Apr. 25, 2018

(65) Prior Publication Data

US 2018/0313910 A1 Nov. 1, 2018

(30) Foreign Application Priority Data

Apr. 28, 2017 (EP) ..................... 17168592

(51) Int. Cl.
*G01R 33/07* (2006.01)
*G01D 3/02* (2006.01)

(52) U.S. Cl.
CPC ............. *G01D 3/02* (2013.01); *G01R 33/075* (2013.01)

(58) Field of Classification Search
CPC ............ G01R 33/0029; G01R 33/0035; G01R 33/02; G01R 33/06; G01R 33/07;
(Continued)

(56) References Cited

U.S. PATENT DOCUMENTS 4,037,150 A * 7/1977 Taranov ................ G01R 15/202
324/251
6,064,202 A 5/2000 Steiner et al.
(Continued)

FOREIGN PATENT DOCUMENTS

EP 2511713 A1 10/2012
EP 2722682 A1 4/2014
(Continued)

OTHER PUBLICATIONS

Extended European Search Report from EP Application No. EP 17168592.8, dated Nov. 10, 2017.
(Continued)

*Primary Examiner* — Patrick Assouad
*Assistant Examiner* — Demetrius R Pretlow
(74) *Attorney, Agent, or Firm* — Workman Nydegger

(57) ABSTRACT

A circuit for biasing and reading out a bridge sensor structure comprises at least two pairs of connection terminals. The circuit comprises an excitation signal generator for generating an excitation signal for biasing and/or exciting the bridge, in which the excitation signal is provided as a non-constant periodic continuous function of time, and a detection circuit for obtaining the sensor signal from the bridge sensor structure by electrically connecting the detection circuit to any pair of connection terminals while applying the excitation signal to another pair. The circuit comprises a switch unit for switching the electrical excitation signal and for switching the detection circuit. A controller controls the switch unit to switch the first pair from being connected to the excitation signal generator at a time when the generated excitation signal is in a predetermined signal range where the excitation signal value is substantially equal to zero.

17 Claims, 5 Drawing Sheets

(58) Field of Classification Search
CPC .. G01R 33/072; G01R 33/075; G01R 33/077; G01R 33/09; G01R 33/091; G01R 33/093; G01R 33/095; G01R 33/096; G01R 33/098; G01R 15/16; G01R 27/26; G01R 27/2605; G01R 31/312; G01D 3/02
See application file for complete search history.

(56) References Cited

U.S. PATENT DOCUMENTS

| | | | |
|---|---|---|---|
| 2014/0009146 A1* | 1/2014 | Blagojevic | G01R 33/04 324/252 |
| 2014/0103921 A1* | 4/2014 | Raman | G01R 33/0023 324/251 |
| 2014/0210462 A1* | 7/2014 | Yamamoto | G01R 33/07 324/251 |
| 2016/0047863 A1* | 2/2016 | Ausserlechner | G01R 33/07 324/225 |
| 2016/0252589 A1* | 9/2016 | Raman | G01R 33/0029 324/224 |

FOREIGN PATENT DOCUMENTS

| | | |
|---|---|---|
| EP | 3358309 A1 | 8/2018 |
| GB | 2489941 A | 10/2012 |

OTHER PUBLICATIONS

Steiner et al., "Offset Reduction in Hall Devices by Continuous Spinning Current Method," Sensors and Actuators A 66, 1998, pp. 167-172.

* cited by examiner

BRIDGE SENSOR BIASING AND READOUT

FIELD OF THE INVENTION

The invention relates to the field of sensors. More specifically it relates to a circuit and method for biasing of a bridge sensor structure and reading out a signal therefrom, such as for biasing and reading out a Wheatstone bridge or a Hall sensor element.

BACKGROUND OF THE INVENTION

It is known in the art of sensor technology to use resistive structures, such as Hall plates or Wheatstone bridges, for detecting physical quantities. For example, Wheatstone bridges may be used in pressure sensors, e.g. using piezo-resistive elements. Likewise, Hall elements may be used for measuring a magnetic field in a current sensor or in an angular position sensor. The passive resistive structures used in such sensors may require the application of an excitation signal, e.g. in the form of a voltage or electrical current, in order to detect an output signal. The term "biasing" refers to a process in which such excitation signal, e.g. a voltage or current, is applied, while the term "readout" refers to retrieving a sensor signal from the resistive structure that is indicative of the physical quantity to be detected by the sensor or indicative of an intermediate physical quantity used for determining the physical quantity to be detected.

Spinning is a technique used in state-of-the-art sensor biasing and readout methods, e.g. for suppressing or compensating for an offset of the resistive bridge structure, e.g. an offset of a Hall plate. In such spinning techniques, nodes of the resistive structure that were first used for biasing, in combination with reading out a sensor signal from different nodes, can thereafter be used for sensing, in combination with biasing different nodes. For example, an excitation signal may alternate between being applied to a first set of nodes and a second set of nodes, while detecting the output signal, e.g. a Hall signal, over the other set of nodes. It is known in the art to implement Hall spinning by abruptly switching a constant bias voltage or current from the first set of nodes to a second set of nodes, while simultaneously using the other set for readout.

For example, such spinning techniques may be applied for offset compensation of Hall plates. Furthermore, spinning of bridges can be used for implementing a continuous self-testing procedure, e.g. for pressure sensors, such as disclosed in the UK patent application no. GB2489941.

Resistive structures, such as Hall plates, may have a significant parasitic capacitance due to a relatively large size of the element. Therefore, the resistive element may behave as an RC circuit, which can limit the dynamic response of the device, thus also limiting the achievable spinning speed. Furthermore, since nodes previously used for biasing can be used for sensing in a following step of applying a spinning technique, a time substantially larger than the RC time constant may be needed to enable the bias voltage to settle to a value that is substantially lower than the biasing voltage, e.g. from a bias voltage of 2V to below 1 μV. Furthermore, low-noise amplification methods known in the art may require a continuous operation over some time to prevent noise aliasing caused by sampling effects. Therefore, after stabilizing to a low voltage, the output signal must be sensed over a sufficiently large time span, thus further constraining the maximum achievable spinning speed while maintaining noise at an acceptable level.

In particular applications, a large bandwidth for the detected signal as function of time may be required. For example, in current sensors, a fast-changing electrical current may be monitored by detecting an associated magnetic field using a Hall sensor. The desirable signal bandwidth may be, for example, of the same order of magnitude as the spinning frequency used to compensate for sensor offsets. Furthermore, flexible digital processing, e.g. post-processing, of the sensor front-end signals may be advantageous. For particular applications, it may also be desirable to sample the readout of each individual spin phase. By sampling the output of each spinning phase, a highly flexible and well-controlled sampling-based processing circuit can be provided for further back-end processing of the sensor signal.

SUMMARY OF THE INVENTION

It is an object of embodiments of the present invention to provide good, efficient and/or fast biasing and read-out of a bridge sensor structure, such as a resistive bridge, e.g. a Wheatstone bridge or a Hall plate.

The above objective is accomplished by a method and device according to the present invention.

It is an advantage of embodiments of the present invention that node switching in a spinning operation of a resistive bridge sensor structure can occur near a zero crossing of the excitation signal, e.g. of a bias voltage, such that a stabilization time of the readout signal after this switching, e.g. due to a parasitic capacitance of the sensor structure, can be reduced or avoided. For example, when spinning operations are applied to the sensor structure, transient signals between different spinning phases can be avoided or reduced when switching is performed near a zero-crossing of the excitation signal. Thus, the resistive bridge sensor structure can be more quickly read out after switching of a set of nodes from an excitation function to a sensing function since less stabilization time is required for avoiding an integration or averaging operation of a monitored readout signal during an uncontrolled transient period, e.g. a time frame after switching in which the readout signal could be characterized by unpredictable and/or stochastic behaviour.

It is an advantage of embodiments of the present invention that fast node switching in a spinning operation of a resistive bridge sensor structure can be achieved, e.g. at switching frequencies in the range of 100 kHz to 50 MHz, e.g. in the range of 500 kHz to 10 MHz, e.g. in the range of 1 MHz to 5 MHz, e.g. about 3 MHz.

It is an advantage of embodiments of the present invention that a low level of readout noise can be achieved, even in a high-speed node spinning operation of a resistive bridge sensor structure.

It is an advantage of embodiments of the present invention that a low level of readout noise can be achieved using a continuous-time readout front-end, e.g. using integration-based low-noise readout, such as charge integration.

It is an advantage of embodiments of the present invention that a reproducible and/or predictable sensor sensitivity can be achieved, e.g. by preventing, compensating and/or controlling bias-source uncertainties, such as stochastic variation of a voltage or electrical current bias signal, errors from dynamic response limitations and/or a drift in readout interval.

It is an advantage of embodiments of the present invention that transient spikes in the excitation signal supplied to, and the readout signal obtained from, a resistive bridge sensor structure can be reduced or avoided.

It is an advantage of embodiments of the present invention that a readout offset of a resistive bridge sensor structure can be controlled, avoided and/or compensated for in a high-speed spinning operation of the sensor structure.

It is an advantage of embodiments of the present invention that a high temporal resolution in monitoring a readout signal obtained from a resistive bridge sensor structure can be achieved while maintaining noise at an acceptable level.

In a first aspect, the present invention relates to a circuit for biasing a bridge sensor structure, e.g. a resistive bridge sensor structure, and for reading out a sensor signal from the bridge sensor structure. The circuit comprises at least two pairs of connection terminals, in which each pair of connection terminals is adapted for connecting to complementary terminals of the bridge sensor structure. For example, the complementary terminals may refer to opposite contacts of the bridge sensor, e.g. opposite with respect to a center of the bridge, e.g. of a cross-shaped or star-shaped bridge.

The circuit further comprises an excitation signal generator for generating an electrical excitation signal for biasing, e.g. for exciting, the bridge sensor structure, in which the excitation signal is generated based on, e.g. provided as, a non-constant periodic continuous function of time. 'Non-constant' may refer to the exclusion of a substantially constant signal, e.g. excluding a signal having no substantial time-dependence. 'Continuous' may refer to the mathematical sense of the term, e.g. such that sufficient small changes in time can result in arbitrarily small changes of the signal value with respect to each point of time.

Thus, the circuit further comprises an excitation signal generator for generating an electrical excitation signal for biasing, e.g. for exciting, the bridge sensor structure, in which the excitation signal does not change abruptly, e.g. stepwise.

For example, the electrical excitation signal may vary less than 50% of its signal range in any time window that has a duration of less than 25% of the period of the periodic function, e.g. less than 25% in any time window having a duration of less than 15% of the period, e.g. less than 20% in any time window having a duration of less than 5% of the period.

The circuit also comprises a detection circuit for obtaining the sensor signal from the bridge sensor structure by electrically connecting the detection circuit to any pair of the at least two pairs of connection terminals while applying the excitation signal to another pair of the at least two pairs of connection terminals.

The circuit comprises a switch unit for switching the electrical excitation signal generated by the excitation signal generator from being supplied to a first pair of the at least two pairs of connection terminals to another pair of the at least two pairs of connection terminals and for switching the detection circuit from being connected to a second pair of the at least two pairs of connection terminals to another pair of the at least two pairs of connection terminals.

The circuit furthermore comprises a controller for controlling the switch unit to switch the first pair from being connected to the excitation signal generator at an instant in time when the excitation signal generator generates the excitation signal in a predetermined signal range, in which range the excitation signal value is substantially equal to a zero reference value.

In a circuit in accordance with embodiments of the present invention, the controller may comprise a comparator and/or an analog to digital converter to detect when the excitation signal is in the predetermined signal range.

In a circuit in accordance with embodiments of the present invention, the controller may be adapted for predicting a time at which the excitation signal value is in the predetermined signal range.

In a circuit in accordance with embodiments of the present invention, the non-constant periodic continuous function may be differentiable, continuously differentiable and/or smooth. References to 'differentiable,' 'continuously differentiable' and 'smooth' may be interpreted in the mathematical sense of such terms.

In a circuit in accordance with embodiments of the present invention, the excitation signal generator may be adapted for generating a sinusoidal electrical current waveform and/or a sinusoidal voltage waveform, and/or a combination of at least two sinusoidal electrical current or voltage waveforms, e.g. $A_1 \cdot \cos(\omega_1 *t+c_1)+A_1 \cdot \cos(\omega_2 *t+c_2)$, where $A_1$ and $A_2$ are amplitudes, $\omega_1$ and $\omega_2$ are angular frequencies and $c_1$ and $c_2$ are phase constants.

In a circuit in accordance with embodiments of the present invention, the excitation signal generator may be adapted for generating the electrical excitation signal in the form of two complementary voltages, e.g. such that the sum of these complementary voltages is substantially constant, e.g. is constant. The controller may be adapted for detecting each zero-crossing of a differential voltage signal, at which zero-crossing the absolute value of the difference between the two complementary voltages is zero or, alternatively, less than a predetermined tolerance threshold, e.g. such that the absolute value of the differential voltage signal is less than the predetermined tolerance threshold at the zero-crossing.

In a circuit in accordance with embodiments of the present invention, the switch unit and the controller may be adapted for applying the two complementary voltages to a selected pair of the at least two pairs of connection terminals, where the selected pair for applying the excitation signal is changed at a predetermined zero-crossing of the detected zero-crossings, e.g. by the switch unit as controlled by the controller, thus iterating over a plurality of spinning phases delimited in time by the detected zero-crossings or a subset of the detected zero-crossings. For example, each detected zero-crossing may mark a next spinning phase, or each spinning phase may comprise the same number of consecutive detected zero-crossings. The spinning phases may be repeatedly iterated over in the same order.

In a circuit in accordance with embodiments of the present invention, the at least two pairs of connection terminals may consist of two pairs of connection terminals for connecting respectively to two node pairs of the bridge sensor structure, in which the switch unit and the controller are adapted for exchanging connections of the pairs of connection terminals to the excitation signal generator and the detection circuit such that the excitation signal is alternatingly applied to each node pair while sensing the sensor signal via the other pair.

In a circuit in accordance with embodiments of the present invention, the detection circuit may be adapted for obtaining the sensor signal in the form of a Hall plate readout signal from the bridge sensor structure in the form of a Hall element, in which the instant in time when the controller controls the switching of the switch unit corresponds to an instant in time when a voltage over the first pair of the at least two pairs of connection terminals is substantially equal to zero.

In a circuit in accordance with embodiments of the present invention, the electrical current supplied to the first pair of connection terminals as excitation signal may be substantially equal to a zero current in the predetermined signal range.

In a circuit in accordance with embodiments of the present invention, the detection circuit may comprise a low noise amplifier for amplifying the sensor signal.

In a circuit in accordance with embodiments of the present invention, the detection circuit may comprise a continuous-time integrator or averager for integrating or averaging the sensor signal, in which the continuous time integrator or averager may be adapted for providing an output signal representative of a continuous-time integral or average of a momentary differential voltage signal over the pair of connection terminals connected to the detection circuit.

In a circuit in accordance with embodiments of the present invention, the circuit may comprise an excitation integrator and/or excitation averager for determining an average bias current and/or a total charge flowing through the pair of connection terminals connected to the excitation signal generator during a predetermined time interval, in which the excitation integrator and/or excitation averager may comprise a capacitor for receiving, during said predetermined time interval, a current which is representative for the biasing current corresponding with the excitation signal.

In a circuit in accordance with embodiments of the present invention, the controller may be adapted for determining an amount of charge stored in the capacitor in that predetermined time interval.

In a circuit in accordance with embodiments of the present invention, the controller may be adapted for determining a sensor readout value based on the integrated or averaged readout signal and on a value indicative of a change of the amount of charge stored in the capacitor during the time interval.

In a circuit in accordance with embodiments of the present invention, the controller may be adapted for applying a zero-banding technique, e.g. a guard banding technique, to exclude residual transient effects in the observed sensor signal.

In a circuit in accordance with embodiments of the present invention, the controller may be adapted for controlling the detection circuit to obtain the sensor signal from the bridge sensor structure only in a further predetermined time interval during each spinning phase and for ignoring or zeroing the sensor signal during the spinning phase when outside this time interval, in which a spinning phase refers to the time in between two consecutive switching actions of the switch unit.

In a circuit in accordance with embodiments of the present invention, the further predetermined time interval may exclude a time frame immediately after switching to the spinning phase. The further predetermined time interval may optionally also exclude a time frame immediately before switching to a next spinning phase.

In a circuit in accordance with embodiments of the present invention, the switch unit and the controller may be adapted for reversing a polarity of the sensed signal.

In a circuit in accordance with embodiments of the present invention, the controller may be adapted for controlling a conventional sensing mode of operation during a first time interval in each spinning phase and controlling a charge-integrating mode of operation during a second time interval in each of spinning phase.

In a circuit in accordance with embodiments of the present invention, the further time interval may be symmetrical in time with respect to a maximum of the applied excitation signal.

In a circuit in accordance with embodiments of the present invention, the further time interval may comprise a central part of the time corresponding to the spinning phase and may exclude start and/or end parts of the duration of the spinning phase.

A circuit in accordance with embodiments of the present invention may be adapted for switching between a floating-plate biasing mode of operation and a charge integrating mode of operation.

In a second aspect, the present invention also relates to a sensor device comprising a bridge sensor structure, e.g. a resistive bridge sensor structure, and a circuit in accordance with embodiments of the first aspect of the present invention, in which each pair of connection terminals of the circuit is connected to corresponding terminals of the bridge sensor structure.

In a further aspect, the present invention also relates to a method for biasing of a bridge sensor structure, e.g. a resistive bridge sensor structure, and reading out a signal therefrom. The bridge sensor structure comprises at least two pairs of nodes, e.g. of complementary terminals. The method comprises generating an electrical excitation signal for biasing the resistive bridge sensor structure, in which the excitation signal is provided as a non-constant periodic continuous function of time. The method also comprises biasing a first pair of nodes of the resistive bridge sensor structure by applying the electrical excitation signal, while obtaining a sensor signal from a second pair of nodes of the resistive bridge sensor structure, e.g. from another pair of nodes that are different from the nodes of the first pair. The method further comprises, e.g. substantially simultaneously, switching the electrical excitation signal from being applied to the first pair of nodes to being applied to another pair of nodes of the bridge sensor structure and switching a sensor signal from being obtained from a second pair of nodes to being obtained from another pair of nodes. For example, the method may comprise switching the first pair of nodes from being connected to receive the electrical excitation signal to being connected to obtaining the sensor signal and switching another pair of nodes, such as the second pair of nodes, from being connected to receive the sensor signal to being connected to receive the electrical excitation signal. This switching is performed at an instant in time when the excitation signal is generated in a predetermined signal range, in which range the excitation signal value is substantially equal to a zero reference value. Thus, in a method in accordance with embodiments, the steps of applying the electrical excitation signal and the step of obtaining the sensor signal may be repeated for different pairs of nodes selected by repeated switching at instants in time when the excitation signal is generated in the predetermined signal range. Each time interval between consecutive switching actions in this repeated switching may be referred to as a spinning phase.

In a method in accordance with embodiments of the present invention, the non-constant periodic continuous function may be differentiable, continuously differentiable and/or smooth.

In a method in accordance with embodiments of the present invention, the excitation signal may be generated as a sinusoidal electrical current waveform and/or a sinusoidal voltage waveform, and/or a combination of at least two sinusoidal electrical current or voltage waveforms, e.g.

$A_1 \cdot \cos(\omega_1 \ast t + c_1) + A_2 \cdot \cos(\omega_2 \ast t + c_2)$, where $A_1$ and $A_2$ are amplitudes, $\omega_1$ and $\omega_2$ are angular frequencies and $c_1$ and $c_2$ are phase constants.

In a method in accordance with embodiments of the present invention, the electrical excitation signal may be generated in the form of two complementary voltages, e.g. complementary sinusoidal voltages. The method may further comprise detecting each zero-crossing of a differential voltage signal, at which zero-crossing the absolute value of the difference between the two complementary voltages is zero or, alternatively, less than a predetermined tolerance threshold.

In a method in accordance with embodiments of the present invention, the step of biasing the first pair of nodes of the resistive bridge sensor structure by applying the electrical excitation signal may comprise applying the larger of the two sinusoidal voltages to the first pair of nodes.

In a method in accordance with embodiments of the present invention, the pair of nodes to which the excitation signal is applied may alternate at each detected zero-crossing, thus iterating over a plurality of spinning phases delimited in time or by the detected zero-crossings or a subset of the detected zero-crossings.

In a method in accordance with embodiments of the present invention, the resistive bridge sensor structure may be a Hall element, the step of detecting the sensor signal from the second pair of nodes may comprise obtaining the sensor signal in the form of a Hall plate readout signal, and the instant in time when the switching is performed may correspond to an instant in time when a voltage over the first pair of nodes is substantially equal to zero.

In a method in accordance with embodiments of the present invention, an electrical current supplied to the first pair of nodes may be substantially equal to a zero current, e.g. may be a zero current, e.g. may have a current magnitude below a predetermined threshold, in the predetermined signal range.

A method in accordance with embodiments of the present invention may comprise using a low noise amplifier for amplifying the sensor signal.

A method in accordance with embodiments of the present invention may comprise integrating or averaging the sensor signal.

In a method in accordance with embodiments of the present invention, the step of integrating or averaging the sensor signal may comprise providing an output signal representative of a continuous-time integral or average of a momentary differential voltage signal over the second pair of nodes.

A method in accordance with embodiments of the present invention may comprise collecting, e.g. integrating over time or averaging in time, a total charge flowing through the first pair of nodes during a predetermined time interval.

A method in accordance with embodiments of the present invention may comprise determining a sensor readout value based on the integrated or averaged readout signal and on a value indicative of the amount of charge stored in the capacitor.

In a method in accordance with embodiments of the present invention, the step of obtaining the sensor signal may comprise obtaining the sensor signal only in a further predetermined time interval during each spinning phase.

In a method in accordance with embodiments of the present invention, the step of obtaining the sensor signal may comprise ignoring or zeroing the sensor signal during the spinning phase when outside the further predetermined time interval.

In a method in accordance with embodiments of the present invention, the further predetermined time interval may exclude a time frame immediately after switching to the spinning phase, e.g. the present spinning phase.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
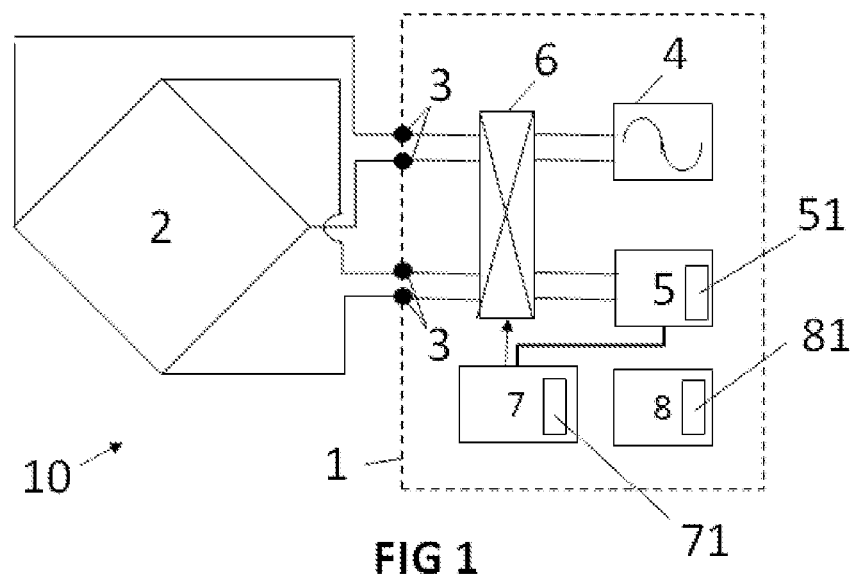
FIG. 1 shows an exemplary circuit and an exemplary sensor device in accordance with embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, the present invention relates to a circuit for biasing a bridge sensor structure, e.g. a resistive bridge sensor structure, and for reading out a sensor signal from that bridge sensor structure. The circuit comprises at least two pairs of connection terminals, in which each pair of connection terminals is adapted for connecting to complementary terminals of the bridge sensor structure. For example, such complementary terminals may form electrical connections to opposite contacts of the bridge structure, e.g. opposite with respect to a center of a cross-shaped, star-shaped or circular bridge sensor structure. The circuit also comprises an excitation signal generator for generating an electrical excitation signal for biasing and/or exciting the bridge sensor structure, in which the excitation signal is provided as a non-constant periodic continuous function of time. The circuit comprises a detection circuit for obtaining the sensor signal from the bridge sensor structure by electrically connecting the detection circuit to any pair of the at least two pairs of connection terminals while applying the excitation signal to another pair of the at least two pairs of connection terminals. The circuit also comprises a switch unit for switching the electrical excitation signal generated by the excitation signal generator from being supplied to a first pair of the at least two pairs of connection terminals to another pair of the at least two pairs of connection terminals and for switching the detection circuit from being connected to a second pair of the at least two pairs of connection terminals to another pair of the at least two pairs of connection terminals. For example, both switching of the first pair to another pair and switching the second pair to another pair may be executed simultaneously, but embodiments of the present invention are not necessarily limited thereto. The switch unit may for example be adapted for switching the first pair of the at least two pairs of connection terminals from being connected to the excitation signal generator to being connected to the detection circuit.

The circuit also comprises a controller for controlling the switch unit to switch the first pair from being connected to the excitation signal generator at an instant in time when the excitation signal generator generates the excitation signal in a predetermined signal range, in which range the excitation signal value is close to a zero reference value of the excitation signal, e.g. in which the excitation is substantially equal to a zero reference, e.g. is equal to a zero reference within a tolerance.

Referring to FIG. 1, a circuit 1 for biasing a resistive bridge sensor structure 2 and for reading out a sensor signal from that resistive bridge sensor structure 2, in accordance with embodiments of the present invention is shown. The resistive bridge sensor structure may for example comprise a Wheatstone bridge. The resistive bridge sensor structure may for example comprise a Hall element, e.g. a Hall plate. The resistive bridge sensor structure may comprise an XMR bridge, e.g. a bridge sensor based on a magnetoresistive effect, such as a giant magnetoresistance effect, a tunnel magnetoresistance effect and/or an anisotropic magnetoresistance effect. A circuit in accordance with embodiments of the present invention may also be adapted for biasing other types of bridge sensor structure, e.g. a capacitive bridge sensor. The circuit comprises at least two pairs of connection terminals 3, in which each pair of connection terminals is adapted for connecting to complementary terminals of the resistive bridge sensor structure 2.

The number of connection terminal pairs may equal two, but may also equal a number N>2. For example, the circuit may be adapted for biasing a multi-contact circular Hall element, e.g. a circular vertical Hall element.

Embodiments of the present invention may also relate to a sensor device 10 comprising a bridge sensor structure, e.g. a resistive bridge sensor structure 2, for example as described hereinabove, and a circuit 1 in accordance with embodiments of the present invention, in which each pair of connection terminals 3 of the circuit is connected to corresponding terminals of the bridge sensor structure 2.

The circuit 1 comprises an excitation signal generator 4 for generating an electrical excitation signal for biasing and/or exciting the bridge sensor structure. For example, the electrical excitation signal may be an electrical current or a voltage.

The excitation signal generator 4 is adapted for generating, e.g. generates in operation of the circuit, the excitation signal as a non-constant periodic continuous function of time. "Non-constant" may refer to the exclusion of a substantially constant function, e.g. that has no significant time-dependence. "Continuous" may refer to the continuity of the function, as function of time, in the mathematical sense. "Periodic" may refer to a repetitive nature of the signal as function of time. The range of this function comprises a zero reference value of the excitation signal, e.g. a zero current value or a reference voltage value, e.g. a zero voltage.

This periodic continuous function of time may have a positive maximum signal value and a negative minimum signal value, e.g. respectively positive and negative with respect to a zero reference level such as a uniform reference voltage of the resistive bridge sensor structure, e.g. a uniform reference voltage of the Hall plate. Particularly, the positive maximum signal value and the negative minimum signal value may be different, e.g. such that the excitation signal is a non-constant function of time that crosses a zero level, e.g. the zero reference value. Alternatively, the zero reference value may correspond to an extremum of the function, or the zero reference value may be close to an extremum of the function, e.g. the zero reference value being at a distance to an extremum that is in a range of 0% to 10%, preferably in a range of 0% to 5%, in a range of 0% to 2% or even in a range of 0% to 1%, relative to the full range of the function.

For example, the periodic continuous function may express the electrical current or the voltage as a function of time. The periodic continuous function may be differentiable, e.g. continuously differentiable. The periodic continuous function may be smooth. References to "continuous", "differentiable" and "smooth" may preferably refer to a mathematical definition of those terms.

For example, the excitation signal generator 4 may comprise a waveform generator. The waveform generator may be adapted for generating the excitation signal, e.g. a voltage as function of time or a current as function of time, at a predetermined frequency or a predetermined combination of frequencies.

In a circuit in accordance with embodiments of the present invention, the periodic continuous function may be a periodic continuous trigonometric function. The excitation signal generator may be adapted for generating a sinusoidal excitation signal, e.g. for generating a sinusoidal electrical current waveform and/or a sinusoidal voltage waveform.

The circuit comprises a detection circuit 5 for obtaining the sensor signal from the bridge sensor structure by electrically connecting the detection circuit to any pair of the at least two pairs of connection terminals 3 acting as a connection to a pair of sensing nodes of the bridge sensor structure while the excitation signal is applied to another pair of the at least two pairs of connection terminals 3 acting as a connection to a pair of excitation nodes of the bridge sensor structure.

The detection circuit 5 may comprise a low noise amplifier for amplifying the sensor signal.

The detection circuit 5 may comprise a continuous-time integrator or averager 51 for integrating or averaging the sensor signal, e.g. integrating or averaging an electrical quantity acquired via the pair of connection terminals acting as connection to the pair of sensing nodes. For example, this electrical signal may be an electrical current or an electrical voltage.

The continuous time integrator or averager may be adapted for providing an output signal representative of a continuous-time integral or average of the momentary differential voltage signal over the pair of sensing nodes.

Particularly, embodiments of the present invention may relate to a device as described in European patent application EP 17154758.1, filed on Feb. 6, 2017. Particularly, the detection circuit 5 may comprise a continuous time integrator or averager as disclosed in said application, and/or the circuit may comprise a biasing circuit, comprising a first and/or second capacitor, and/or a control unit as disclosed therein, wherein the biasing current $I_{bias}$ for the biasing circuit may be supplied by the excitation signal generator 4.

The circuit 1 also comprises a switch unit 6 for switching the electrical excitation signal generated by the excitation signal generator from being supplied to a first pair of the at least two pairs of connection terminals to another pair, e.g. the second pair referred to further hereinbelow or a different pair, of the at least two pairs of connection terminals and for switching the detection circuit from being connected to a second pair of said at least two pairs of connection terminals to (yet) another pair, which may be the first pair or a different pair, of the at least two pairs of connection terminals.

For example, the switch unit may be adapted for switching a first pair of the at least two pairs of connection terminals from being connected to the excitation signal generator 4 to being connected to the detection circuit 5, e.g. such that nodes of the resistive bridge sensor structure connected to this pair of connection terminals switch from being used as excitation nodes to being used as sensing nodes. Likewise, the switch unit 6 may be adapted for switching a second pair of the at least two pairs of connection terminals from being connected to the detection circuit 5 to being connected to the excitation signal generator 4, e.g. simultaneously with switching the first pair of the at least two pairs of connection terminals from being connected to the excitation signal generator 4 to being connected to the detection circuit 5. Likewise the switching unit 6 may be adapted for switching the first pair of the at least two pairs of connection terminals from being connected to the detection circuit 5 to being connected to the excitation signal generator 4.

The switching from the first pair to another pair and the switching from the second pair to another pair may be performed simultaneously, but embodiments of the present invention are not necessarily limited thereto.

For example, the at least two pairs of connection terminals may comprise two pairs of connection terminals for connecting respectively to two pairs of terminals of the bridge sensor structure. The bridge nodes of each pair may be arranged opposite of each other, e.g. along a line that is perpendicular to the line on which the other pair of nodes are arranged. Thus, an excitation signal may be applied to either node pair while sensing a sensor signal using the other pair. The switch unit 6 and the controller 7 may be adapted for switching connections of the pairs of connection terminals to the excitation signal generator and the detection circuit such that either pair can act as sensing nodes while the other pair can act as excitation nodes. Furthermore, the switch unit 6 and the controller 7 may be adapted for interchanging the nodes of each pair in such connection, e.g. such as to reverse polarity of the sensed signal.

The circuit 1 also comprises a controller 7 for controlling the switch unit 6 to switch the first pair from being connected to the excitation signal generator at an instant in time when the excitation signal generator 4 generates the excitation signal in a predetermined signal range, in which the excitation signal value in this range is close to a zero reference value of the excitation signal, e.g. substantially equal to the zero reference value, e.g. in a predetermined tolerance range around the zero reference value. The predetermined signal range may cover less than 10% of the full range of the generated excitation signal, e.g. less than 5%, e.g. less than 2%, e.g. less than 1%. The controller 7 may comprise a comparator and/or an analog to digital converter 71 to detect when the excitation signal is in the predetermined signal range.

For example, in this predetermined range, a voltage over the first pair of the at least two pairs of connection terminals may be substantially equal to a uniform reference voltage of the resistive bridge sensor structure, e.g. of the Hall plate.

For example, in this range, an electrical current supplied to the first pair of the at least two pairs of connection terminals as excitation signal may be substantially equal to a zero current, e.g. equal to a zero current.

Particularly, the switch unit 6 and/or the controller 7 may be adapted for implementing a spinning technique as known in the art, e.g. for biasing and readout of a Hall plate. This spinning may refer to an operation in which readout of the sensor element is performed in phases, where excitation nodes and readout nodes switch roles in subsequent phases. The switch unit 6 and the controller 7 may be adapted for implementing a spinning method such that excitation nodes and sensing nodes of the bridge are rotated in opposite directions in each consecutive step of the spinning method.

Figure 2:
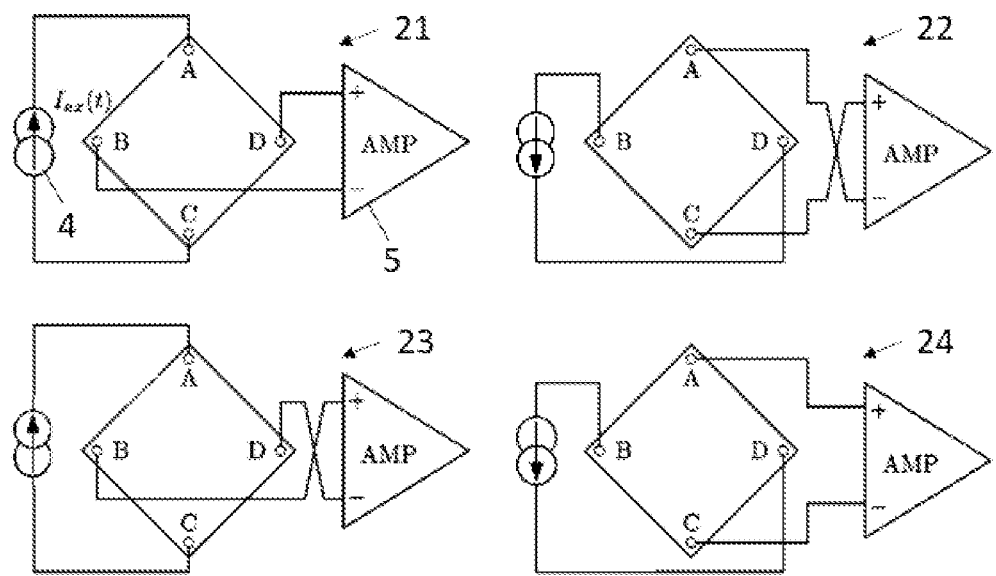
FIG. 2 schematically illustrates a spinning operation in accordance with embodiments of the present invention.

Referring to FIG. 2, an exemplary spinning operation is illustrated. The excitation signal generator 4 may generate the excitation signal as a periodic continuous time-varying signal, e.g. an excitation electrical current $I_{ex}(t)$. In operation, the controller 7 and the switch unit 6 may electrically switch connection of the excitation signal generator 4 from being applied over a first pair of nodes A,C of the bridge element in a first phase 21 to being applied over a second pair of nodes B,D in a second phase 22, to being applied over the first pair of nodes A,C in a third phase 23 and to being applied to the second pair of nodes B,D in a fourth phase 24. Likewise, in operation, the controller 7 and the switch unit 6 may electrically switch connection of the detection circuit 5 from receiving the sensor signal from the second pair of nodes B,D of the bridge element in the first phase 21 to receiving the sensor signal from the first pair of nodes A,C in a second phase 22, to receiving the sensor signal from the second pair of nodes B,D in the third phase 23 and to receiving the sensor signal from the first pair of nodes A,C in the fourth phase. The phases 21,22,23,24 may be performed consecutively in the described order, and the procedure may be repeated by restarting at the first phase 21 after the fourth phase 24.

Figure 3:
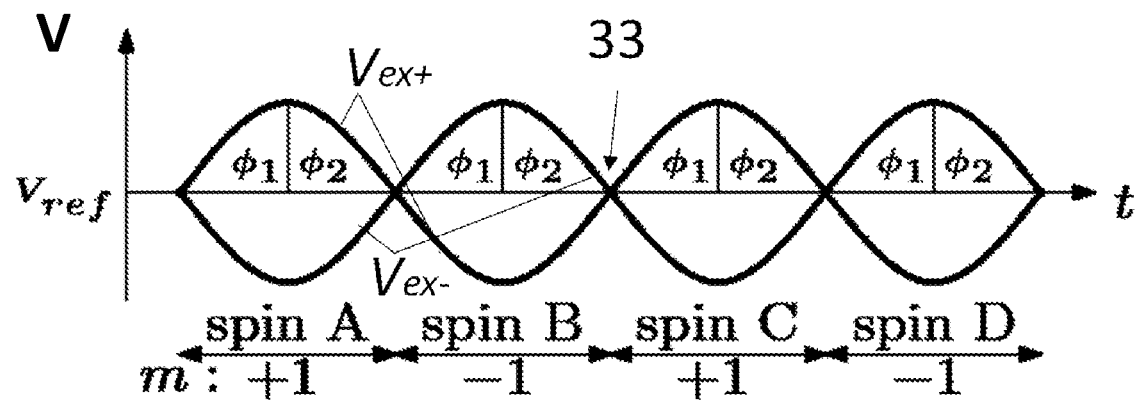
FIG. 3 shows a plurality of spinning phases in accordance with embodiments of the present invention.

Referring to FIG. 3, the excitation signal generator 4 may be adapted for generating an electrical excitation signal for biasing the resistive bridge sensor structure in the form of two complementary voltages, $V_{ex+}$ and $V_{ex-}$, for example complementary sinusoidal voltages. The controller 7 may be adapted for detecting each zero-crossing 33 of the differential voltage signal, e.g. where $V_{ex+}=V_{ex-}$, or where $|V_{ex+}-V_{ex-}|<\delta$ for a tolerance threshold $\delta$, or alternatively, to infer such zero-crossing by synchronous timing with respect to the operating frequency of the excitation signal generator. At each detected or inferred zero-crossing, a spinning phase transition may be initiated by the controller 7, e.g. by controlling the switch unit 6.

The switch unit and the controller may be adapted for applying the larger of the two excitation voltages to a pair of the connection terminals, where the selected pair for applying the excitation signal alternates at each spinning phase transition between the spinning phases spin A, spin B, spin C, spin D. It is an advantage of such push-only excitation that a floating-plate biasing loop can be made pull-only, thus allowing a simple implementation.

The circuit 1 may also comprise an excitation integrator and/or excitation averager 8. This excitation integrator and/or excitation averager may determine an average bias current and/or a total charge flowing through the pair of nodes used for excitation during a time interval, e.g. during a single spinning phase or a predetermined fraction of the time of a single spinning phase, e.g. during half of the time of a single spinning phase. For example, the controller 7 may be adapted for controlling a conventional sensing mode of operation $\varphi_1$ during a first time interval in each spinning phase and controlling a charge-integrating mode of operation $\varphi_2$ during a second time interval in each spinning phase.

For example, the excitation integrator and/or excitation averager 8 may comprise a capacitor 81 connected such as to allow a biasing current corresponding to the excitation signal to flow through the resistive sensor structure and into the capacitor during a predetermined time interval. The controller may be adapted for determining an amount of charge stored in the capacitor in this time interval. The controller may be adapted for determining a sensor readout value based on the integrated or averaged readout signal and on a value indicative of the charge stored in the capacitor.

Figure 5:
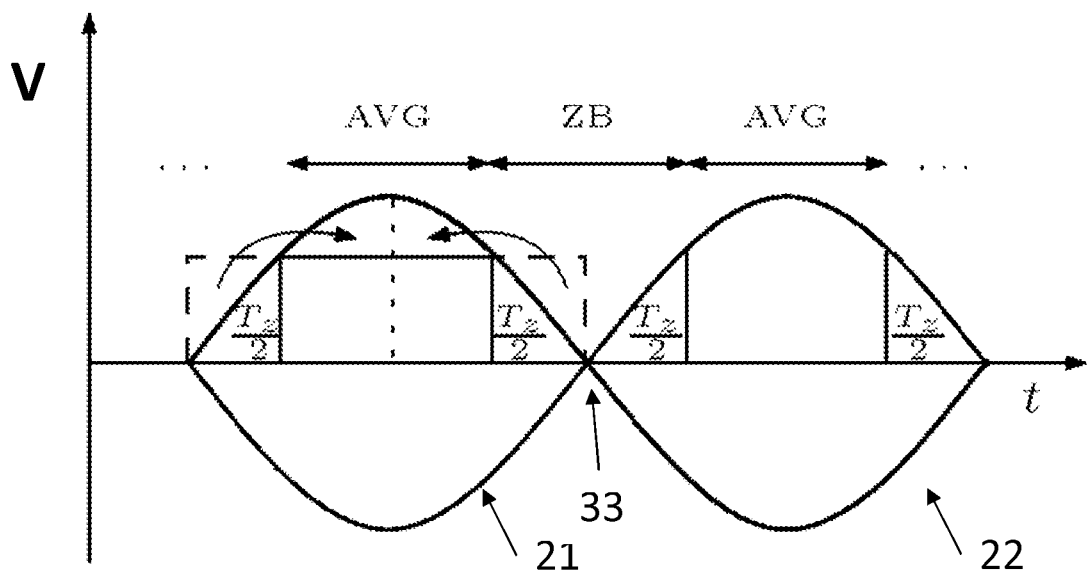
FIG. 5 schematically illustrates a spinning operation in accordance with embodiments of the present invention.

The controller 7 may be adapted for controlling the detection circuit 5 to obtaining the sensor signal from the resistive bridge sensor structure only in a predetermined time interval during each spinning phase, e.g. for ignoring the sensor signal during the spinning phase when outside this time interval. The time interval may exclude a time frame immediately after switching to the spinning phase and/or a time frame immediately before switching to the next spinning phase. The time interval may be symmetrical in time with respect to a maximum of the applied excitation signal. For example, the time interval may comprise of a central part of the time corresponding to the spinning phase and exclude start and/or end parts of the time corresponding to the spinning phase. Thus, the controller may be adapted for applying a zero-banding technique to exclude residual transient effects in the observed sensor signal, for example. Referring to FIG. 5, two spinning phases 21,22, separated by a switching action at a zero-crossing 33 of the differential sinusoidal voltage signal, are shown. The sensor signal may be obtained, e.g. integrated or averaged, from the resistive bridge sensor structure only in a predetermined time interval AVG during each spinning phase. The time intervals $T_7/2$ immediately after switching to each spinning phase and immediately prior to switching to the next spinning phase may thus be excluded from the sensor signal acquisition time frame AVG. Since switching is performed near the zero-crossings 33, e.g. at the zero-crossings taking a margin of tolerance into account, the magnitude of switching spikes can be advantageously low, such that the time interval $T_z$ in which zero-banding is applied can be small. An implementation of the detection of a zero-crossing of the excitation signal may be limited in accuracy, e.g. due to an amplifier offset, which may drift, and a limited bandwidth when detecting the zero-crossing moments with an analog comparator. Also, mismatch in charge injection from the switch unit may result in residual spikes being present.

The readout signal, e.g. the voltage between readout nodes, may be mathematically modelled as:

$$V_{RO}(t) = V_H + V_{bias}(t_0) \cdot e^{-\frac{t-t_0}{\tau}} + V_n.$$

In which $V_H$ is a Hall voltage to be determined, $\tau = R_H \cdot C_H$ is a dominant RC time constant of the Hall element having a resistance $R_H$ and a parasitic capacitance $C_H$, $V_n$ represents noise, and $V_{bias}(t_0)$ is the bias voltage that is present at the readout nodes just prior to the transition into the current spinning phase, e.g. due to a prior use as excitation nodes. The Hall voltage $V_H$ may be expressed as $V_H = S_I I_b B$, where Si is the sensitivity of the Hall plate, $I_b$ is the bias current and B the external magnetic field to be quantified. When applying an averaging operation over the time interval AVG, $$\langle \dots \rangle = \frac{1}{T_s - T_z} \int_{T_z/2}^{T_s - T_z/2} \dots dt,$$

where $T_s$ refers to the length of the spinning phase, this results, assuming a bias current $$I_{bias}(t) = \frac{\pi}{2} I_b \sin(\pi \cdot t / T_s),$$

which (for comparison) has an equal average to a constant bias current $I_b$ applied over the same spin phase time $T_s$, in an averaged readout signal of $$\langle V_{RO} \rangle = S_I I_b \frac{\cos\left(\alpha \frac{\pi}{2}\right)}{1-\alpha} B + V_{bias}(t_0) \frac{T}{T_s - T_z} \left( e^{-\frac{T_z/2}{\tau}} - e^{-\frac{T_s - T_z/2}{\tau}} \right) + \langle V_n \rangle,$$

where $\alpha$ is the zero-banding time fraction $T_z/T_s$.

For comparison, such averaging operation, using zero-banding over a period $T_z$ immediately following a spinning phase transition, when applied to a constant bias current $I_b$ over the same spin phase time would result in:

$$\langle V_{RO} \rangle = S_I I_b B + V_{bias}(t_0) \frac{T}{T_s - T_z} \left( e^{-\frac{T_z}{\tau}} - e^{-\frac{T_s}{\tau}} \right) + \langle V_n \rangle.$$

Figure 6:
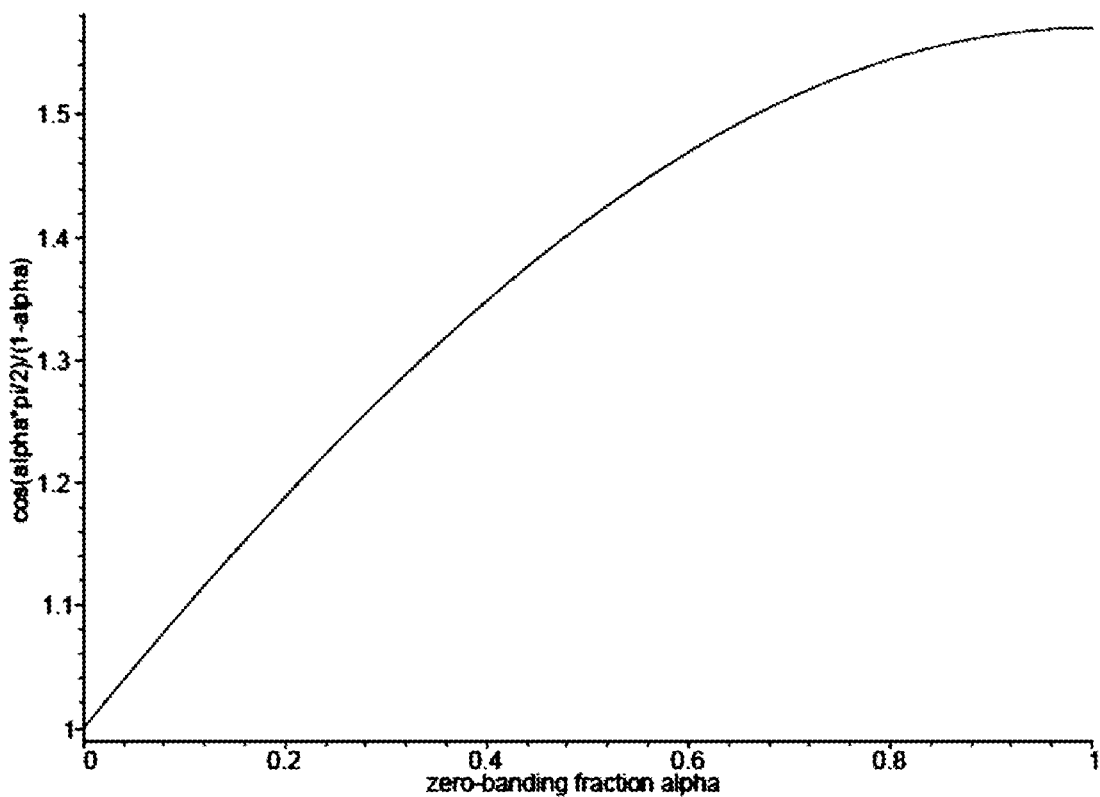
FIG. 6 shows a scaling factor of a time-averaged signal comparing a sinusoidal bias current to a constant bias current as a function of a zero-banding fraction a, illustrating embodiments of the present invention.

Therefore, an additional factor $$\frac{\cos\left(\alpha \frac{\pi}{2}\right)}{1-\alpha}$$

can be observed when comparing the averaging operation for a sinusoidal bias current to a constant bias current. This factor is illustrated in FIG. 6. Since this factor is larger than 1 in substantially all situations in which zero-banding is applied, the effective Hall signal indicative of the magnetic field B to be detected also has larger magnitudes, and a better signal-to-noise ratio can be obtained, compared to when a constant bias current having the same average value is used. Due to a better bias current concentration, the amplification of subsequent gain stages in a sensor device may be lowered, and the error sources in $\langle V_{RO} \rangle$ may have less impact.

Assuming that the noise $V_n$ has a white noise distribution, a root-mean-square error quantification can be obtained for the reference condition in which a constant bias current is used:

$$V_{RO,rms} = \sqrt{E[\langle V_{RO} \rangle^2]} = \sqrt{\left[ V_{bias}(t_0) \frac{\tau}{T_s - T_z} \left( e^{-\frac{T_z}{\tau}} - e^{-\frac{T_s}{\tau}} \right) \right]^2 + \frac{N_0}{2(T_s - T_z)}}$$

Where $N_0$ represents the level of the single-sided spectral power density in the auto-correlation function $$E[V_n(t)V_n(\tau)] = \frac{N_0}{2} \delta(t - \tau).$$

The expression of the RMS can be reformulated as:

$$v_{RO,rms} = \sqrt{\left[ v_0 \frac{e^{-\alpha n} - e^{-n}}{(1-\alpha)n} \right]^2 + \frac{1}{1-\alpha}}$$

where $$v_0 = \frac{V_{bias}(t_0)}{\sqrt{N_0 \times \frac{f_s}{2}}}$$

is a normalization of the spike height to the RMS noise level of the white noise ($f_s = 1/T_s$), and $n = T_s/\tau$ expresses the spinning phase time in a number of RC time constants.

Likewise, applying the same noise model and normalizations to the sinusoidal bias current, results in the expression:

$$v_{RO,rms} = \frac{1-\alpha}{\cos\left(\alpha \frac{\pi}{2}\right)} \sqrt{\left[ v_0 \frac{e^{-\frac{\alpha}{2}n} - e^{-\left(1-\frac{\alpha}{2}\right)n}}{(1-\alpha)n} \right]^2 + \frac{1}{1-\alpha}}.$$

Figure 7:
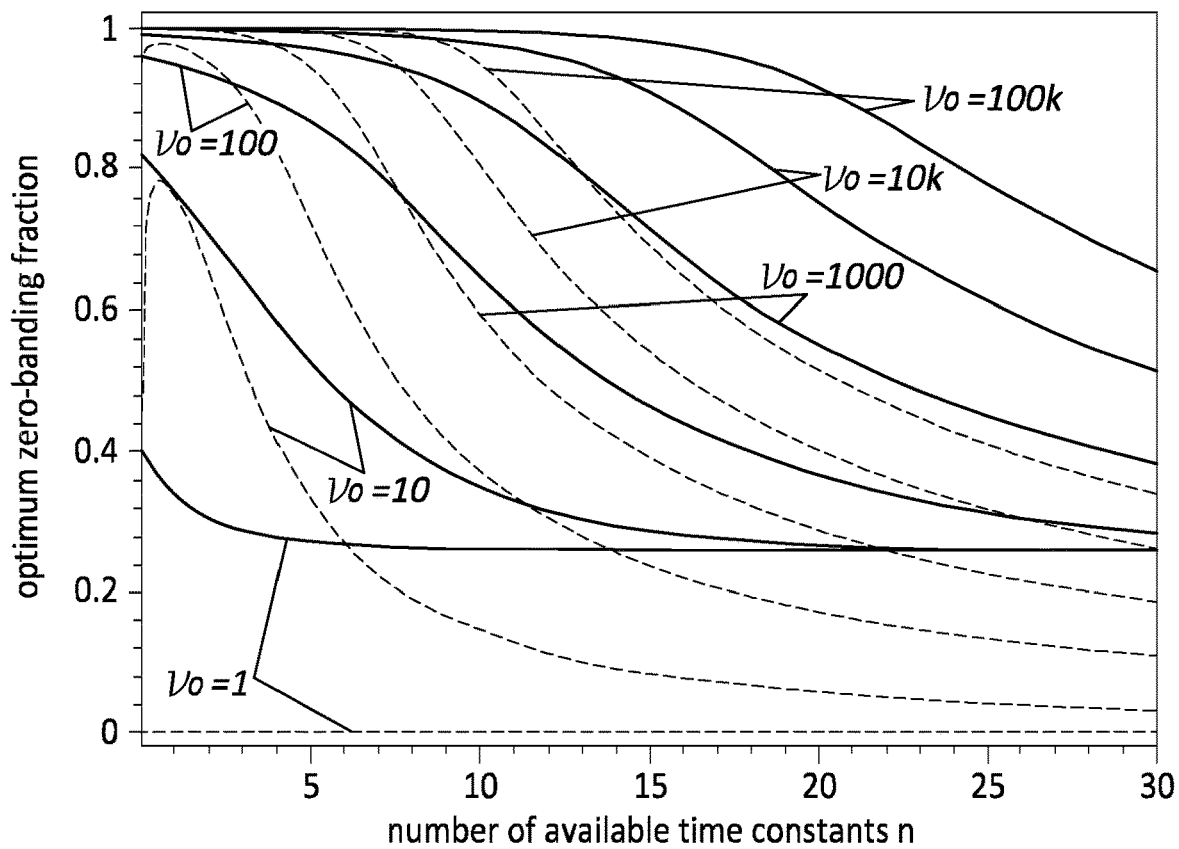
FIG. 7 illustrates optimum zero-banding fractions $\alpha$, as a function of a parameter n representative of a number of available RC time constants, for illustrating embodiments of the present invention.

FIG. 7 illustrates optimum zero-banding fractions $\alpha$, determined numerically, as a function of the parameter n. The solid lines represent the case of sinusoidal excitation signals, and the dashed lines represent the case of constant bias currents. Curves are shown for $v_0$ values of 1, 10, 100, 1000, 10000 and 100000. These plots show that for equal $v_0$, a longer zero-banding time may be needed in the case of sinusoidal excitation. This can be understood, since in the particular approach being analyzed, the switching occurs in the middle of the zero-band interval, as compared to at the start of the zero-band interval for the constant excitation case, and thus only half of the time is available for exponential decay. However, since with sinusoidal excitation switching is done near zero crossings of the excitation, the corresponding $v_0$ value may be orders of magnitude smaller, and so comparison should be preferably made w.r.t. curves more to the left.

Figure 8:
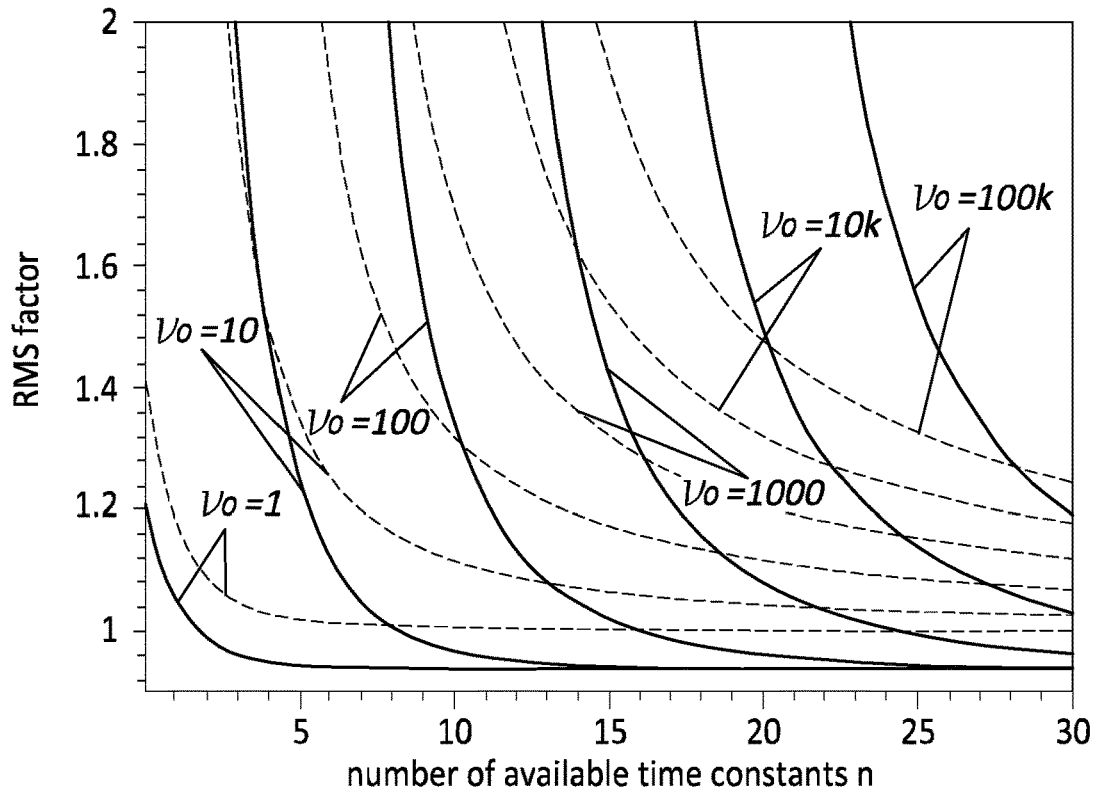
FIG. 8 illustrates optimum root-mean-square factors as a function of the parameter n, for illustrating embodiments of the present invention.

FIG. 8 illustrates optimum RMS factors, determined numerically and normalized relative to the noise RMS when averaging over the full spin phase time, as a function of the parameter n. The solid lines represent the case of sinusoidal excitation signals, and the dashed lines represent the case of constant bias currents. Curves are shown for $v_0$ values of 1, 10, 100, 1000, 10000 and 100000. For the same $v_0$, sinusoidal excitation and abrupt switching of a constant bias current are competitive, the best option depending on the number n of available time constants. Sinusoidal excitation therefore can outperform abrupt switching of a constant bias current for equal $v_0$. e.g. due to a current concentration effect for boosting the Hall signal when the readout signal is acquired. For example, abrupt switching of a constant current may waste bias current during the zero-phase, while sinusoidal excitation more effectively spends current in the appropriate time frame. Nevertheless, the $v_0$ spike magnitude is significantly reduced by switching near a zero-crossing of the excitation. Therefore, the performance in practice may be dominated by the solid lines more to the left side of the graph.

Figure 4:
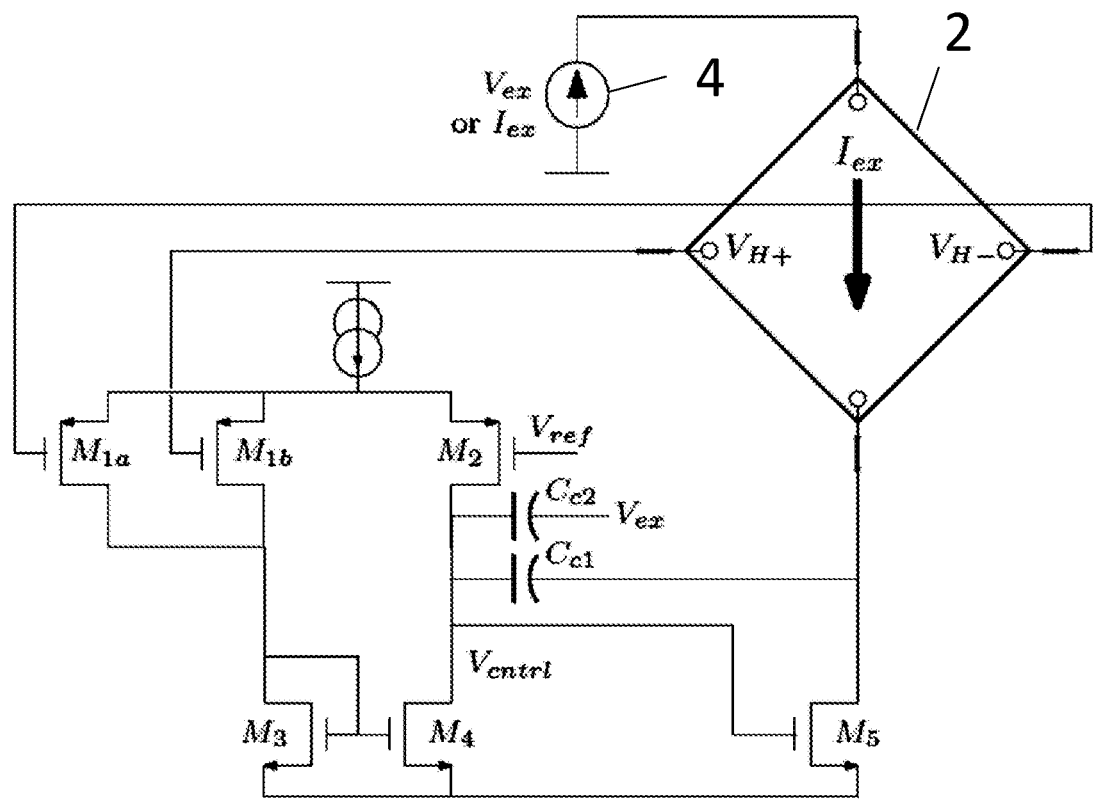
FIG. 4 illustrates part of a circuit in accordance with embodiments of the present invention.

FIG. 4 shows an exemplary circuit diagram of part of a circuit in accordance with embodiments of the present invention. For sake of clarity, the switch unit 6 and the controller 7 are not shown, thus providing a static view of equivalent operation of the circuit 1 in a single phase of a spinning approach in accordance with embodiments of the present invention. The circuit may function in a floating-plate biasing mode, e.g. similar to alternatives described in European Patent EP 2722682. The excitation signal generator 4 supplies the excitation signal, e.g. a voltage $V_{ex}$ or current $I_{ex}$, which is applied via a first terminal of a pair of connection terminals, configured by the switch unit 6 in accordance with the present spinning phase, to a first excitation node of the bridge element 2, e.g. the Hall plate. A common-mode voltage, $V_{H+}$ and $V_{H-}$, of the readout nodes, e.g. via another pair of connection terminals configured by the switch unit 6 in accordance with the present spinning phase, is compared to a reference voltage $V_{ref}$. The error may be used for adapting a sinking current applied by $M_5$ to a second excitation node, by changing a control voltage $V_{cntrl}$. This feedback loop may be stabilized by capacitors $C_{c1}$ and $C_{c2}$. Thus, the electrical excitation signal may be generated as two complementary voltages, e.g. a first voltage supplied by a voltage source $V_{ex}$ and a complementary second voltage supplied to the other node of the excitation node pair by the circuit as described hereinabove.

In a further aspect, the present invention also relates to a method for biasing of a bridge sensor structure, e.g. a resistive bridge structure such as a Wheatstone bridge or a Hall sensor structure, and reading out a signal therefrom. The bridge sensor structure comprises at least two pairs of nodes, e.g. electrically connecting to pairs of contacts of the bridge structure in which the contacts of each pair may be oppositely arranged with respect to a center of the bridge structure, e.g. of a cross, star or circle shaped bridge sensor structure.

Figure 9:
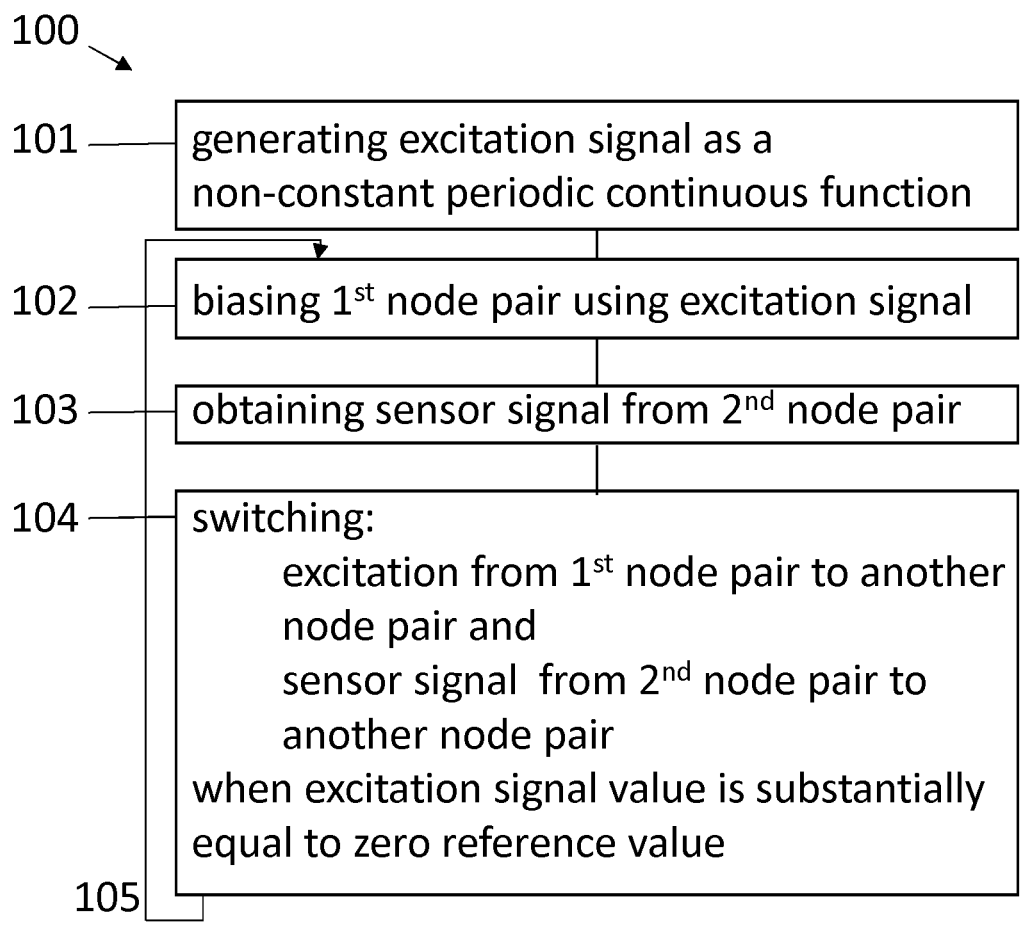
FIG. 9 shows a method in accordance with embodiments of the present invention.

Referring to FIG. 9, a method 100 in accordance with embodiments of the present invention is shown.

The method 100 comprises generating 101 an electrical excitation signal for biasing the bridge sensor structure, in which the excitation signal is provided as a non-constant periodic continuous function of time. The method also comprises biasing and/or exciting 102 a first pair of nodes of the bridge sensor structure by applying the electrical excitation signal, while obtaining 103 a sensor signal from a second pair of nodes of the bridge sensor structure, e.g. from another pair of nodes that are different from the nodes of the first pair. The method further comprises, e.g. substantially simultaneously, switching 104 the electrical excitation signal from being applied to the first pair of nodes to being applied to another pair of nodes and switching a sensor signal from being obtained from a second pair of nodes to being obtained from another pair of nodes, e.g. switching the first pair of nodes from being connected to receive the electrical excitation signal to being connected to obtaining the sensor signal and switching another pair of nodes, such as the second pair of nodes, to being connected to receive the electrical excitation signal. This switching is performed at an instant in time when the excitation signal is generated in a predetermined signal range, in which range the excitation signal value is substantially equal to a zero reference value. Thus, in a method in accordance with embodiments, the steps of biasing 102 by applying the electrical excitation signal and the step of obtaining 103 the sensor signal may be repeated 105 for different pairs of nodes in each iteration, the different pairs of nodes being selected by repeated switching 104 at instants in time when the excitation signal is generated in the predetermined signal range. Each time interval between consecutive switching actions, e.g. each iteration, in this repeated switching may be referred to as a spinning phase.

In a method in accordance with embodiments of the present invention, the non-constant periodic continuous function may be differentiable, continuous differentiable and/or smooth.

In a method in accordance with embodiments of the present invention, the excitation signal may be generated 101 as a sinusoidal electrical current waveform and/or a sinusoidal voltage waveform.

In a method in accordance with embodiments of the present invention, the electrical excitation signal may be generated 101 in the form of two complementary voltages, e.g. complementary sinusoidal voltages. The method may further comprise detecting each zero-crossing of a differential voltage signal, at which zero-crossing the absolute value of the difference between the two complementary voltages is zero or, alternatively, less than a predetermined tolerance threshold.

In a method in accordance with embodiments of the present invention, the step of biasing 102 the first pair of nodes of the bridge sensor structure by applying the electrical excitation signal may comprise applying the larger of the two sinusoidal voltages to the first pair of nodes.

In a method in accordance with embodiments of the present invention, the pair of nodes to which the excitation signal is applied, e.g. in the step of biasing 102, may alternate at each detected zero-crossing, thus iterating over a plurality of spinning phases delimited in time by the detected zero-crossings.

In a method in accordance with embodiments of the present invention, the resistive bridge sensor structure may be a Hall element, the step of obtaining 103 the sensor signal from the second pair of nodes may comprise obtaining the sensor signal in the form of a Hall plate readout signal, and the instant in time when the switching 104 is performed may correspond to an instant in time when a voltage over the first pair of nodes is substantially equal to a zero reference voltage of the Hall element.

In a method in accordance with embodiments of the present invention, an electrical current supplied to the first pair of nodes, e.g. in the step of biasing 102, may be substantially equal to a zero current, e.g. may be a zero current, e.g. may have a current magnitude below a predetermined threshold, in the predetermined signal range.

A method in accordance with embodiments of the present invention may comprise using a low noise amplifier for amplifying the sensor signal.

A method in accordance with embodiments of the present invention may comprise integrating or averaging the sensor signal.

In a method in accordance with embodiments of the present invention, the step of integrating or averaging the sensor signal may comprise providing an output signal representative of a continuous-time integral or average of a momentary differential voltage signal over the second pair of nodes.

A method in accordance with embodiments of the present invention may comprise determining, e.g. by integrating over time or averaging in time, an average bias current and/or a total charge flowing through the first pair of nodes during a predetermined time interval.

A method in accordance with embodiments of the present invention may comprise determining a sensor readout value based on the integrated or averaged readout signal and on a value indicative of the amount of charge stored in the capacitor.

In a method in accordance with embodiments of the present invention, the step of obtaining 103 the sensor signal may comprise obtaining the sensor signal only in a further predetermined time interval during each spinning phase.

In a method in accordance with embodiments of the present invention, the step of obtaining 103 the sensor signal may comprise ignoring or zeroing the sensor signal during the spinning phase when outside the further predetermined time interval.

In a method in accordance with embodiments of the present invention, the further predetermined time interval may exclude a time frame immediately after switching 104 to the spinning phase, e.g. the present spinning phase, and a time frame immediately before switching to a next spinning phase.

The invention claimed is:

1. A circuit for biasing a bridge sensor structure and for reading out a sensor signal from said bridge sensor structure, the circuit comprising:
    at least two pairs of connection terminals including a first pair of connection terminals and a second pair of connection terminals, each pair of said at least two pairs of connection terminals being adapted for connecting to complementary terminals of said bridge sensor structure;
    an excitation signal generator for generating an electrical excitation signal for biasing and/or exciting the bridge sensor structure, wherein said excitation signal is provided as a non-constant periodic continuous function of time, wherein the function is defined in a range comprising a zero reference value of the excitation signal;
    a detection circuit electrically connected to one of the first pair or second pair of said at least two pairs of connection terminals, said detection circuit being configured to obtain said sensor signal from said bridge sensor structure while said excitation signal is applied to at least a different one of the first pair or the second pair of said at least two pairs of connection terminals;
    a switch unit that
        switches the electrical excitation signal generated by the excitation signal generator from being supplied to the first pair of said at least two pairs of connection terminals to the second pair of said at least two pairs of connection terminals and switches the detection circuit from being connected to the second pair of said at least two pairs of connection terminals to the first pair of said at least two pairs of connection terminals and
        switches the electrical excitation signal generated by the excitation signal generator from being supplied to the second pair of said at least two pairs of connection terminals to the first pair of said at least two pairs of connection terminals and switches the detection circuit from being connected to first pair of said at least two pairs of connection terminals to the second pair of said at least two pairs of connection terminals; and
    a controller that controls said switch unit to switch the electrical excitation signal and the detection circuit at an instant in time when said excitation signal generator generates the excitation signal substantially equal to a zero reference value at a distance to an extremum in a range of 0% to 10% relative to the full range of the function,
    wherein the controller is adapted to detect the value of the excitation signal being substantially equal to the zero reference value,
    wherein the controller further includes a comparator that detects when the excitation signal is substantially equal to the zero reference value in said range of 0% to 10%, and
    wherein the controller controls said switch unit to switch the electrical excitation signal and the detection circuit when the comparator detects said signal in said range.

2. The circuit of claim 1, wherein said excitation signal generator is adapted for generating a sinusoidal electrical current waveform and/or a sinusoidal voltage waveform as said electrical excitation signal.

3. The circuit of claim 1, wherein said excitation signal generator is adapted for generating said electrical excitation signal in the form of two complementary voltages and wherein said controller is adapted for detecting each zero-crossing of a differential voltage signal calculated as an absolute value of the difference between said two complementary voltages, at which zero-crossing the absolute value of the difference between said two complementary voltages is zero or, alternatively, less than a predetermined tolerance threshold.

4. The circuit of claim 3, wherein said switch unit and said controller are adapted for applying said two complementary voltages to the first pair of the at least two pairs of connection terminals, where said switch unit and said controller are adapted for switching the excitation signal from being supplied to the first pair of said at least two pairs of connection terminals to the second pair of said at least two pairs of connection terminals at a predetermined zero-crossing of said detected zero-crossings, thus iterating over a plurality of spinning phases delimited in time by said detected zero-crossings or a subset of said detected zero-crossings.

5. The circuit of claim 1, wherein said at least two pairs of connection terminals consists of the first pair and the second pair of connection terminals for connecting respectively to a first node pair and a second node pair of the bridge sensor structure, said switch unit and said controller being adapted for exchanging connections of the first pair and second pair of connection terminals to the excitation signal generator and the detection circuit such that said excitation signal is alternatingly applied to one of the first node pair and second node pair while obtaining said sensor signal via another of the first node pair and the second node pair.

6. The circuit of claim 1, wherein said detection circuit is adapted for obtaining said sensor signal in the form of a Hall plate readout signal from said bridge sensor structure being a resistive bridge structure in the form of a Hall element.

7. The circuit of claim 1, wherein, when said excitation signal generator generates the excitation signal substantially equal to a zero reference value, an electrical current as said excitation signal supplied to said first pair of connection terminals is substantially equal to a zero current at a distance to an extremum in a range of 0% to 10% relative to the full range of the function.

8. The circuit of claim 1, wherein said detection circuit comprises a low noise amplifier for amplifying said sensor signal.

9. The circuit of claim 1, wherein said detection circuit comprises a continuous-time integrator or averager for integrating or averaging said sensor signal, wherein the sensor signal is an electrical quantity acquired via the first pair or second pair of connection terminals connected to the pair of sensing nodes, and wherein said continuous time integrator or averager is adapted for integrating or averaging said electrical quantity.

10. The circuit of claim 1, wherein said circuit comprises an excitation integrator and/or excitation averager for determining an average current and/or a total charge flowing through the pair of connection terminals connected to the excitation signal generator during a predetermined time interval, said excitation integrator and/or excitation averager comprising a capacitor receiving during said predetermined time interval a current representative for a biasing current corresponding to said excitation signal.

11. The circuit of claim 10, wherein said controller is adapted for determining a sensor readout value based on said integrated or averaged readout signal and on a value indicative of a change of the amount of charge stored in the capacitor during said time interval;
wherein said detection circuit comprises a continuous-time integrator or averager for integrating or averaging said sensor signal.

12. The circuit of claim 1, wherein said controller is adapted for controlling the detection circuit to obtain the sensor signal from the bridge sensor structure only in a predetermined time interval during each spinning phase wherein the spinning phase refers to the time in between two consecutive switchings of the switch unit, and for ignoring or zeroing the sensor signal during the spinning phase when outside said predetermined time interval.

13. The circuit of claim 12, wherein said predetermined time interval excludes a time frame immediately after said two consecutive switchings.

14. A sensor device comprising a bridge sensor structure and a circuit in accordance with claim 1, wherein each pair of connection terminals of the circuit is connected to corresponding terminals of the bridge sensor structure.

15. A method for biasing of a bridge sensor structure and reading out a sensor signal from said bridge sensor structure, in which the bridge sensor structure comprises at least two pairs of nodes, the method comprising:
generating an electrical excitation signal, in which the excitation signal is generated as a non-constant periodic continuous function of time, wherein the function is defined in a range comprising a zero reference value of the excitation signal,
biasing a first pair of nodes of the bridge sensor structure by applying the electrical excitation signal while obtaining the sensor signal from a second pair of nodes of the bridge sensor structure,
switching the electrical excitation signal from being applied to the first pair of nodes to being applied to another pair of nodes of the bridge sensor structure and switching the sensor signal from being obtained from a second pair of nodes to being obtained from another pair of nodes,
wherein said switching is performed at an instant in time when the excitation signal is substantially equal to the zero reference value at a distance to an extremum in a range of 0% to 10% relative to the full range of the function,
wherein said switching is controlled by a controller, wherein the controller detects the value of the excitation signal being substantially equal to a zero reference value, and the controller further includes a comparator that detects when the excitation signal is substantially equal to the zero reference value in said range of 0% to 10%, and
wherein the controller controls said switch unit to switch the electrical excitation signal and the detection circuit when the comparator detects said signal in said range.

16. The circuit of claim 9, wherein the sensor signal is a momentary differential voltage signal over the pair of sensing nodes, and wherein said continuous time integrator or averager is adapted for providing an output signal representative of a continuous-time integral or average of the momentary differential voltage signal over the pair of connection terminals connected to the detection circuit.

17. The circuit of claim 11, wherein the sensor signal is a momentary differential voltage signal over the pair of sensing nodes, and wherein said continuous time integrator or averager is adapted for providing an output signal representative of a continuous-time integral or average of the momentary differential voltage signal.

* * * * *